United States Patent [19]

Sloane

[11] 4,335,373

[45] Jun. 15, 1982

[54] METHOD FOR ANALYZING A DIGITAL-TO-ANALOG CONVERTER WITH A NONIDEAL ANALOG-TO-DIGITAL CONVERTER

[75] Inventor: Edwin A. Sloane, Los Altos, Calif.

[73] Assignee: Fairchild Camera & Instrument Corp., Mountain View, Calif.

[21] Appl. No.: 264,928

[22] Filed: May 18, 1981

Related U.S. Application Data

[63] Continuation-in-part of Ser. No. 204,979, Nov. 7, 1980.

[51] Int. Cl.³ ............................................. H03K 13/02
[52] U.S. Cl. ............................. 340/347 CC; 371/15; 340/347 DA; 364/727; 364/826
[58] Field of Search .............................. 364/727, 826; 340/347 DA, 347 CC, 347 NT; 371/23, 24, 25, 26, 27, 15; 324/73 R, 73 AT

[56] References Cited

U.S. PATENT DOCUMENTS

| | | | |
|---|---|---|---|
| 3,816,813 | 6/1974 | Jehu | 340/347 CC |
| 4,061,017 | 12/1977 | Sloane | 364/826 |
| 4,266,292 | 5/1981 | Regan | 371/25 |

OTHER PUBLICATIONS

Cukier, "IBM Technical Disclosure Bulletin", vol. 22, No. 5, Oct. 1979, pp. 1892–1893.

Flamien, "IBM Technical Disclosure Bulletin", vol. 22, No. 11, Apr. 1980, p. 4952.

Pau, "Fast Testing and Trimming of A/D and D/A Converters in Automatic Test Systems", published in the Proceedings of Autotestcon, 1978, IEEE Catalog, 78CH1416-7, Nov. 1978, pp. 268–274.

Primary Examiner—Charles D. Miller
Attorney, Agent, or Firm—Paul J. Winters; Theodore Scott Park; Michael J. Pollock

[57] ABSTRACT

A method for statistically calibrating a digital-to-analog converter with an electronic test system. The digital-to-analog converter is excited with two state signals at each input bit which together represent a single signal with uniform amplitude probability with respect to time, and wherein each excitation signal is orthogonal with respect to all other excitation signals. The output of the digital-to-analog converter is detected by an analog-to-digital converter which has been calibrated by premeasured weighting coefficients with respect to two-state orthogonal signals. The digital time domain output signals are then mapped into a transform domain to obtain weighting coefficients of each bit of the output response. Finally the transform domain weighting coefficients are weighted by the reciprocal of the premeasured weighting coefficients to obtain the unbiased weight of each bit of the digital-to-analog converter under test. A preferred set of excitation signals is a set of Walsh function signals representing the digital equivalent of a linear ramp function.

10 Claims, 2 Drawing Figures

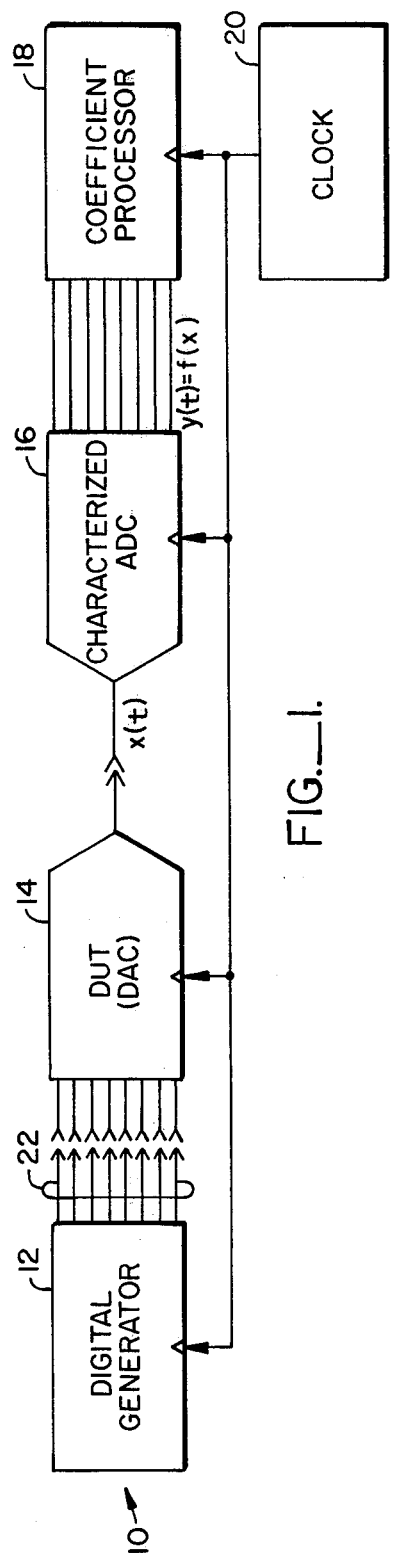
FIG._1.
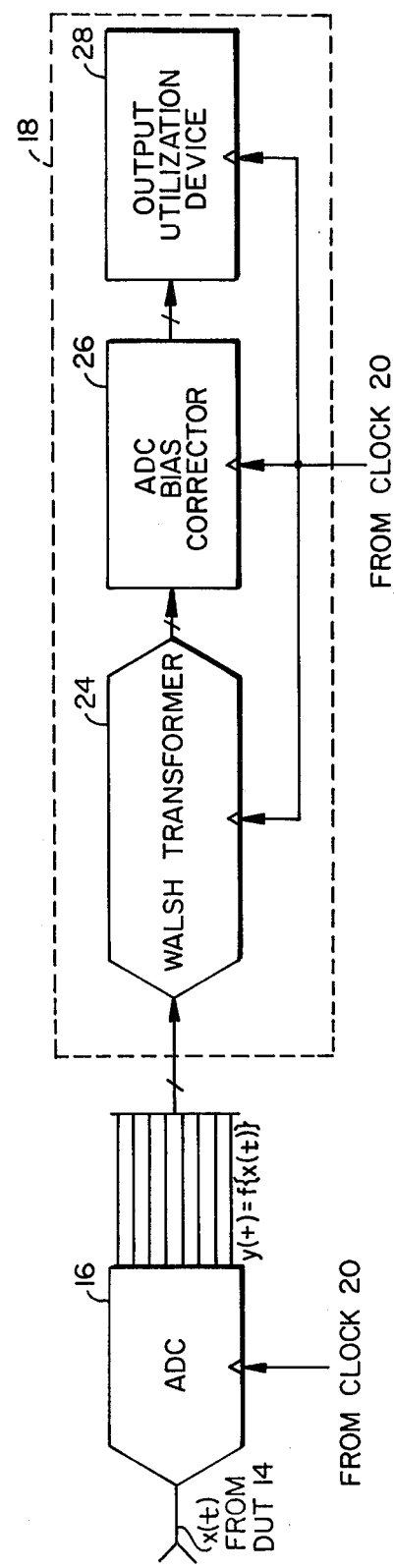
FIG._2.

METHOD FOR ANALYZING A DIGITAL-TO-ANALOG CONVERTER WITH A NONIDEAL ANALOG-TO-DIGITAL CONVERTER

This application is a continuation-in-part of copending patent application Ser. No. 204,979, filed Nov. 7, 1980.

BACKGROUND OF THE INVENTION

1. Field of Invention

This invention relates to automatic test systems for digital electronic converters and particularly to statistical methods and related electronic apparatus for testing digital-to-analog converters.

Converters between the digital and analog signal domains are employed to interface digital electronic circuitry and analog devices. Accuracy of conversion, gain and repeatability in the process of conversion are matters of concern. One method of testing a digital-to-analog converter is to apply a digital signal to its input to obtain an analog output signal, and then to apply the analog output signal to the input of an analog-to-digital converter to recover a digital signal and then to compare the digital output signal with a standard such as the digital input signal or to process the output signal to determine its statistical characteristics. The characteristics of the output signal in terms of a statistical description provide an indication of the accuracy of the digital-to-analog converter.

2. Description of the Prior Art

State of the art testing techniques for digital converters are generally limited to tesing, in the case of digital-to-analog converters, a few states such as the simple binary weights and full-scale amplitude. Substantially all tests are static in nature and are incapable of providing a complete statistical evaluation of a converter.

Recently dynamic testing techniques have been suggested for limited purposes. An example is a method proposed by L. F. Pau and presented in a paper entitled "Fast Testing and Trimming of A/D and D/A Converters in Automatic Test Systems" at the 1978 IEEE Autotest Conference. Pau suggested analyzing the error signal with Walsh functions. The error signal is obtained by comparing to a reference device. Other known evaluation methods also presupposed the use of an ideal reference device, such as an analog-to-digital converter having a linear transfer characteristic, the output response of which is employed with the output response of a device under test to generate an error signal from which an evaluation of performance is made. A device built according to the technique suggested by Pau is therefore limited by the accuracy of the reference device.

One of the concerns of prior art converter testing methods has been an inability to distinguish between signal-induced biases or errors and biases or errors inherent in the testing devices. Accordingly, much effort has been devoted to linearization of the excitation signals and of the transfer characteristics of the measuring devices, such as the analog-to-digital converter used to detect the output of the digital-to-analog converter under test. The present invention represents a departure from this effort to idealize the testing equipment.

3. Cross-Reference to Related Application

In the copending parent patent application entitled "Method and Apparatus for Digital Converter Testing," a method and apparatus are disclosed for dynamically testing the overall performance characteristics of both digital-to-analog converters and analog-to-digital converters. The method comprises dynamically exercising an analog or digital converter with, respectively, analog or digital signal patterns which can be characterized as the sum of a set of mutually orthogonal two-state functions of defined amplitudes, the sum having substantially uniform amplitude distribution over the allowable states of the amplitude range in order to exercise substantially all allowable converter states of concern at random times. Thereafter, the response of the converter under test is examined for a number of basic performance parameters, including total distortion, linearity and optimum gain. The method described therein yields a relatively complete statistical description of the performance characteristics. The disclosure of that application is incorporated herein by reference and made a part hereof.

SUMMARY OF THE INVENTION

According to the invention, a digital-to-analog converter (DAC) is calibrated by exciting the digital inputs from an exciter which generates, at each bit input, a known two-state signal which is orthogonal with respect to all other excitation signals, the sum of the excitation signals representing a single signal with uniform amplitude probability with respect to time. Such a set of digital signals is a maximum entropy sequence. The analog output signal of the DAC under test is then provided to an analog-to-digital converter which has been calibrated by premeasured weighting coefficients with respect to two state orthogonal signals. The digital time domain output signals of the analog to digital converter are then mapped into or transformed to a transform domain to obtain weighting coefficients of each bit of the output response. Finally the transform domain weighting coefficients are weighted by the reciprocal of the premeasured weighting coefficients to obtain the unbiased weight of each bit of the digital to analog converter under test.

A key to the invention is the excitation of the device under test with a known binary function consisting of orthogonal functions in a maximum entropy sequence such that a single orthogonal function is weighted to excite a corresponding bit. A preferred set of excitation signals is a set of Walsh function signals representing the digital equivalent of a linear ramp function.

The maximum entropy sequence from which excitation signals are generated according to the invention comprises a set of two-state orthogonal Walsh functions, each Walsh function being separately weighted by bit position to correspond to a specific bit magnitude of the DAC under test. In this manner the bias factor of each bit of the DAC under test can be separately identified.

The method according to the invention may be employed in an automatic test system to obtain a complete statistical description of the accuracy of conversion of the DAC under test independent of sequence of conversion.

One of the advantages and nonobvious consequences of the present invention is its ability to specify the transfer characteristics of a DAC under test by use of a nonlinear ADC. Specifically, substantial linearity distortion in the trasfer characteristic of the ADC can be tolerated provided the bit weighting coefficients of the ADC are nonzero (thus providing no information). However, an underlying assumption of the invention is that the nonlinearity of the ADC must be known to at least the degree of precision implied by the bit coefficient of the least significant bit of the DAC.

A further advantage of the invention is that bias errors in the estimate of the coefficients of any maximum entropy sequence representing a DAC output are invariant for all maximum entropy sequences. Hence, the distortions introduced by the testing apparatus are virtually eliminated. An analysis of the invention shows that a DAC can be tested by an ADC that has distortion in the transfer characteristic. Moreover, an analysis of the invention shows a large tolerance to imperfections in the ADC used as a testing device.

This invention will better understood by reference to the following detailed description of specific embodiments taken in connection with the accompanying drawings.

BRIEF DESCRIPTION OF THE DRAWINGS

FIG. 1 is a block diagram of an apparatus operative according to the method of the invention.

FIG. 2 is more detailed block diagram of an apparatus operative according to the method of the invention.

DETAILED DESCRIPTION OF SPECIFIC EMBODIMENTS

FIG. 1 illustrates, in block diagram form, a test apparatus 10 which might operate according to the present invention to test a digital-to-analog converter (DAC) device under test (DUT) 14. The apparatus 10 comprises two essential elements, namely, a digital generator 12 having a specificially-defined output signal and a characterized analog-to-digital converter (ADC) 16. By "characterized," it is meant that the ADC 16 has a transfer characteristic known for each bit in terms of a set of orthogonal two-state functions, such as Walsh functions. The coefficients of the functions, which are real numbers, are thereafter employed in a coefficient processor 18 to analyze the Device under Test (DUT) 14, as hereinafter explained. A clock 20 provides overall synchronization for the test apparatus 10.

The generator 12 must be operative to generate a digital output signal representing a set of two-state orthogonal functions in a maximum entropy sequence. Examples of two-state orthogonal functions are the sequences 0,1,0,1,0,1,0,1; 0,0,2,2,0,0,2,2; and 0,0,0,0,4,4,4,4, which is a set of three Walsh functions, 1,0,0,1,1,0,1,0; 2,0,2,0,0,2,2,0; and 0,4,0,0,4,4,4,0, which is a set of orthogonal functions which can be obtained by permuting the order of the Walsh function maximum entropy sequence. The sum of each set of three is an integer function that is uniformly distributed on the interval 0 to 7. Specifically, a maximum entropy sequence might be a discrete digitized signal defining a repetitive ramp or any other signal having uniform amplitude distribution over the sampling period of interest, as shown above. The output of the generator 12 is via a digital bus 22 wherein each signal line is a bit signal line of a different order of magnitude. Each bit of the digital bus 22 is excited by a different binary orthogonal function. Since each bit is separately and independently weighted, depending on the bit assignment, the overall output of the generator 12 is a set of binary orthogonal functions. A preferred set of binary orthogonal functions is the Walsh functions although other binary orthogonal functions having essentially equivalent characteristics are also suitable in the invention. A specific embodiment is described in reference to the Walsh functions for simplicity.

The output on bus 22 is applied to the input of the DAC device under test (DUT) 14. Each input bit of the DUT 14 is excited by a single orthogonal function. Because the generator 12 provides a pure digital signal, the binary weights at the input form an ideal input signal from which an analog output is obtained which can be analyzed. The analog output signal must be analyzed to determine the dynamic transfer function of the DUT 14. When the bit pattern applied to each one of the input bits of the DUT 16 is a Walsh function, the analog output signal can also be described in terms of a set of Walsh functions. Since each such bit pattern is applied to a different input bit, there is an implicit relative binary weight of $2^m$ for each coefficient $a_m$ of the Walsh functions which represent the output of the DUT 14, where m corresponds to the order of the bit to which the input Walsh function is applied by means of the bus 22.

The object of the invention is to obtain the set of coefficients $a_m$ of the output Walsh functions which characterize the output transfer function of the DUT 14, where $a_m$ is the weight of the $m^{th}$ bit of the DUT 14.

According to the invention, the transfer characteristic of the DUT 14 is obtained after first determining the transfer characteristic of the ADC 16 and then measuring the digital output at each bit output of the ADC 16. To this end the coefficient processor 18 comprises a Walsh transform processor 24 having its output coupled to a bias corrector 26 which in turn has its output coupled to an output utilization device 28 (FIG. 2).

The signal out of the DUT 14 and into the ADC 16 is a function x(t). The signal out of the ADC 16 resulting from the input analog function x(t) is an output digital function y(t), where y(t)=f{x(t)}.

Significantly, the transfer characteristic of the ADC 16 can be expressed in terms of Walsh functions with coefficients dependent upon identifiable nonlinearities which are independent of any excitation sequence. This result follows because the special digital generator 12 is a maximum entropy exciter. The bias factors introduced by the ADC 12 are invariant with respect to the choice of the set of orthogonal functions used as a specific excitation pattern as long as the excitation bit pattern constitutes a maximum entropy sequence.

It is also significant to the invention and not immediately apparent that the number of bias factors corresponds to the number of bits, i.e., the number of input lines to the DUT 16, and not to the number of allowable states of the DUT 16. The characterized bias factors are compensated for in a bias corrector 26 to which the output of the ADC 12 is applied.

The output of the bias corrector 26 is the set of output Walsh coefficients $a_m$ which characterize the DUT 14 signal. The signal processing of the output Walsh coefficients, as well as the characteristics of orthogonality and of Walsh functions, have been taught elsehwere, as for example in my paper entitled "Application of Walsh Functions to Converter Testing" presented Nov. 11, 1980 and published in *Proceedings of the* 1980 *Auto Test Conference* (IEEE 80-CH1608-9) and incorporated herein by reference. The output of the processed Walsh coefficients is applied to an output utilization device 28 such as a display device or the like.

Because it is not immediately apparent that the bias factors can be determined independently of the particular maximum entropy excitation signal, the following theoretical analysis and explanation is presented. This discussion shows the bias introduced by a nonlinear, nonideal ADC is substantially independent of the device, even in dynamic testing, so long as the excitation signal is a maximum entropy sequence and the DUT 16 nonlinearities are moderate.

Analyzing a maximum entropy sequence signal applied to an ADC 12 through an unknown linear transfer function where the input is x(t), the output y(t) may be expressed as follows:

$$y(t) = f\{x(t)\} \qquad (1)$$

x(t) being an input maximum entropy sequence.

Assume that the function y(t) is defined as the sum of distortion and a sequence of weighted Walsh functions.

$$y(t) = \sum_{m=0}^{M-1} \hat{a}_m \psi_{l,m}(t) + \epsilon(t) \qquad (2)$$

where
Ψ(t) is the Walsh function;
l is the order of the Walsh function;
m is the bit index;
M is the number of bits of the converter associated with the $m^{th}$ bit;
$\hat{a}_m$ is the weight of the $m^{th}$ bit after passing through the transfer function f(x); and
$\epsilon(t)$ is a term representing residual distortion.

It follows therefore that the coefficient $\hat{a}_m$ is the integral of the product of the function y(t) and the $l^{th}$ order Walsh function corresponding to the $m^{th}$ bit over time or $$\hat{a}_m = \frac{1}{T} \int_T y(t)\psi_{l,m}(t)dt \qquad (3)$$

$$= \frac{1}{T} \int_T f\{x(t)\}\psi_{l,m}(t)dt$$

By the Ergodic Hypothesis which establishes the equivalence of time and statistical averages, it can be shown that the coefficient $\hat{a}_m$ is the expected value of the product of the function f(x) and the $l^{th}$ order Walsh function for the $m^{th}$ bit. This expected value is equal to the double integral over x and Ψ of the product of $\Psi_l(x)$, f(x), and the joint amplitude density function of x and $\Psi_{l,m}(t)$ or $$\hat{a}_m = E\{f(x) \cdot \psi_{l,m}(x)\} \qquad (4)$$

$$= \int \int f(x)\psi_{l,m}(x)p\{x, \psi_{l,m}\}d\psi dx$$

where
E{.} is the expected value of the product; and p{.} is the joint amplitude probability density function.

The joint amplitude probability density function is a two-dimensional distribution that describes the probability that the two state Walsh function $\Psi_{l,m}(x)$ is on or off for a given value of x. Inasmuch as the variable x(t) is substantially uniformly distributed in amplitude according to the invention, then permuting the order of the excitation sequences does not change the probability that a given bit will be on or off for a given excitation value.

It therefore follows that the density function $p(x,\Psi_{l,m})$ is equal to the joint density of a given value of x occurring when the binary order, or $_2m^{th}$ order, Walsh function is on or off or $$p(x, \Psi_{l,m}) = p(x, \Psi_{2m}) \qquad (5)$$

or uniformly distributed x.

Hence from equation (4) above, the coefficient $a_m$ is the expected value of the product of the $_2m^{th}$ order Walsh function and the function f(x) or $$\hat{a}_m = E\{f(x)\psi_{2m}(x)\} \qquad (6a)$$

$$= \int \int f(x)\psi_{2m}(x)p(x, \psi_{2m})d\psi dx$$

$$= \int f(x)[\int \psi_{2m}(x)p(x, \psi_{2m})d\psi]dx$$

By examination of the activity of each bit of the excitation sequence it is possible to derive the density function p(x, $\Psi_{2m}$) and then integrate the density function over all possible values of x.

Table I shows the density function p(x,Ψ) for a ramp x = −1 to +1 for a four-bit range, or the sum of four Walsh functions:

TABLE I

| x | $\psi_2 0$ | | $\psi_2 1$ | | $\psi_2 2$ | | $\psi_2 3$ | |
|---|---|---|---|---|---|---|---|---|
| | −1 | +1 | −1 | +1 | −1 | +1 | −1 | +1 |
| +15/16 | 0 | 1/16 | 0 | 1/16 | 0 | 1/16 | 0 | 1/16 |
| +13/16 | 0 | 1/16 | 0 | 1/16 | 0 | 1/16 | 1/16 | 0 |
| +11/16 | 0 | 1/16 | 0 | 1/16 | 1/16 | 0 | 0 | 1/16 |
| +9/16 | 0 | 1/16 | 0 | 1/16 | 1/16 | 0 | 1/16 | 0 |
| +7/16 | 0 | 1/16 | 1/16 | 0 | 0 | 1/16 | 0 | 1/16 |
| +5/16 | 0 | 1/16 | 1/16 | 0 | 0 | 1/16 | 1/16 | 0 |
| +3/16 | 0 | 1/16 | 1/16 | 0 | 1/16 | 0 | 0 | 1/16 |
| +1/16 | 0 | 1/16 | 1/16 | 0 | 1/16 | 0 | 1/16 | 0 |
| −1/16 | 1/16 | 0 | 0 | 1/16 | 0 | 1/16 | 0 | 1/16 |
| −3/16 | 1/16 | 0 | 0 | 1/16 | 0 | 1/16 | 1/16 | 0 |
| −5/16 | 1/16 | 0 | 0 | 1/16 | 1/16 | 0 | 0 | 1/16 |
| −7/16 | 1/16 | 0 | 0 | 1/16 | 1/16 | 0 | 1/16 | 0 |
| −9/16 | 1/16 | 0 | 1/16 | 0 | 0 | 1/16 | 0 | 1/16 |
| −11/16 | 1/16 | 0 | 1/16 | 0 | 0 | 1/16 | 1/16 | 0 |
| −13/16 | 1/16 | 0 | 1/16 | 0 | 1/16 | 0 | 0 | 1/16 |
| −15/16 | 1/16 | 0 | 1/16 | 0 | 1/16 | 0 | 1/16 | 0 |

Referring to Table I, if integration of Ψ is carried out in equation 6(a) over the Ψ dimension, then the evaluation of equation (6a) simply becomes $$\hat{a}_m = \frac{1}{2X} \int_{-X}^{X} f(x)\psi_{2m}(x)dx \qquad (6b)$$

The transfer function f(x) of the characterized ADC 16 may be represented as a sum of Walsh functions weighted by coefficients $\alpha_n$ or $$f(x) = \sum_{n=0}^{\infty} \alpha_n \psi_n(x) \qquad (7)$$

Substituting equation (7) and the solution to the density function into equation (6b) for integration over all values of x, the coefficient $\hat{a}_m$ is determined to be the sum of the weighted integrated products of two Walsh functions in x normalized by the span of x, or $$\hat{a}_m = \frac{1}{2X} \sum_{n=0}^{\infty} \alpha_n \int_{-X}^{X} \psi_n(x)\psi_{2m}(x)dx \qquad (8)$$

Since the Walsh functions are orthogonal, the product thereof is equal to unity whenever the order is equal, and is zero otherwise, i.e., $$\int \Psi_n(x) \Psi_{2^m}(x)dx = 1 \quad (9)$$

for $n = 2^m$.

$$\int \Psi_n(x) \Psi_{2^m}(x)dx = 0 \quad (10)$$

for $n \neq 2^m$.

It follows immediately from equation (8) that the estimated weight $\hat{a}_m$ is equal to the weighting coefficient $\alpha$ of the $2m^{th}$ order Walsh function that describes the transfer characteristic $f(x)$ or $$\hat{a}_m = \alpha_{2m} \quad (11)$$

Equation (11) implies that the nonlinearity in the ADC 16 appears as a time-independent bias in the estimate of $a_m$. Specifically, the unbiased estimate of the $m^{th}$ bit weight of the ADC 16 is the biased estimate of the weight due to all known and unknown factors introduced between the known input and the measured output at the input of the coefficient processor 18 and the scaled product of the reciprocal of the related weighting coefficient $\alpha_{2m}$ or $$\hat{a}_m = \frac{\hat{a}_m}{2^m \alpha_{2m}} \quad (12)$$

According to the invention, the bias correction terms $2^m \alpha_{2m}$ of the ADC 16 are known values stored in the ADC bias corrector 26 (FIG. 2). The output signals of the Walsh transformer 24, which are the coefficients $\hat{a}_m$ of the Walsh transform of the output y(t) signals are corrected by the bias correction terms $\overline{2^m \alpha_{2m}}$ according to the relationship in equation (12) to produce the unbiased coefficients $\hat{a}_m$. For example, if $\alpha_{2m}$ equals $a_m$, then the bit weight of the coefficient $a_m$ is simply $2^m$. The unbiased coefficients $a_m$ specify the transfer characteristic of the DUT 14. More parricularly, the unbiased weighting coefficients $a_m$ appear in the x(t) function of the DUT 14 as follows:

$$x(t) = \sum_{m=0}^{M-1} a_m \Psi_{l,m}(t) \quad (13)$$

Because the $\Psi_{l,m}(t)$ is absolutely known (since it is the digital excitation function of the digital generator 14), x(t) is known and the DUT 14 is calibrated.

Many forms of digital excitation signals are suitable in the invention. A signal particularly well suited is the set of individual binary signals which represents a linear amplitude ramp which may be repeated.

The invention has now been explained in respect of specific embodiments. Other embodiments will be apparent to those of ordinary skill in this art. It is therefore not intended that the invention be limited except as indicated in the appended claims.

What is claimed is:

1. A method for calibrating a digital-to-analog converter (DAC) comprising the steps of:
exciting inputs of the DAC under test from an excitation means generating known digital excitation signals, each said excitation signal being applied at a single digital bit input of the DAC under test and each said excitation signal being binary and orthogonal with respect to all other ones of said excitation signals, the sum of said excitation signals consisting of a maximum entropy sequence of uniform amplitude probability, said DAC under test producing an analog output signal;
providing said analog output signal of the DAC under test at an analog input of an analog-to-digital converter (ADC), the transfer function of said ADC having been characterized by premeasured weighting values of a set of binary orthogonal functions, said ADC producing digital output signals;
transforming said digital output signals from time domain digital signals into binary transform domain digital signals to obtain an output response weighting coefficient for each bit of the converter under test; and
correcting each said output response weighting coefficient for bias errors induced by said ADC by multiplying each output response weighting coefficient by the reciprocal of each corresponding said premeasured weighting values in a bias correction means in order to obtain unbiased weighting values of each bit specifying the transfer characteristic of the digital-to-analog converter under test.

2. The method according to claim 1 wherein the excitation signals are Walsh function signals.

3. The method according to claim 2 wherein the transforming step comprises transforming time domain digital signals into corresponding Walsh transform domain signals.

4. The method according to claim 3 wherein said digital excitation signals comprise together a digital representation of a linear amplitude ramp.

5. The method according to claim 1 wherein the unbiased weighting coefficient of the $m^{th}$ bit of a digital-to-analog converter under test is represented by:

$$a_m = \frac{\hat{a}_m}{2^m \alpha_{2m}}$$

where
$\hat{a}_m$ is the output response weighting coefficient of the $m^{th}$ bit; and
$\alpha_{2m}$ is the premeasured weighting coefficient of the $2m^{th}$ order output of said analog-to-digital converter, and wherein said correcting step comprises multiplying each output response weighting coefficient by the corresponding premeasured weighting value $2^m/\alpha_{2m}$.

6. An apparatus for calibrating a digital-to-analog converter (DAC) comprising:
means for exciting inputs of the DAC under test from an excitation means operative to generate known digital excitation signals at selected digital excitation signal outputs, each said excitation signal output being adapted to be coupled to a single digital bit input of the DAC under test and each said excitation signal being binary and orthogonal with respect to all other ones of said excitation signals, the sum of said excitation signals consisting of a maximum entropy sequence of uniform amplitude probability, said DAC under test producing an analog output signal at an analog output signal terminal;
an analog-to-digital converter (ADC) adapted to be coupled to said analog output signal terminal, the transfer function of said ADC having been characterized by premeasured weighting values of a set of binary orthogonal functions, said ADC being operative to produce digital output signals in response to said analog output signal;

means for transforming said digital output signals from time domain digital signals into binary transform domain digital signals to obtain an output response weighting coefficient for each bit of the converter under test; and means for correcting each said output response weighting coefficient for bias errors induced by said ADC by multiplying each output response weighting coefficient by the reciprocal of each corresponding said premeasured weighting values in order to obtain unbiased weighting values of each bit specifying the transfer characteristic of the digital-to-analog converter under test.

7. The apparatus according to claim 6 wherein said exciting means is a Walsh function signal generator.

8. The apparatus according to claim 7 wherein the transforming means comprises means for transforming time domain digital signals into corresponding Walsh transform domain signals.

9. The apparatus according to claim 8 wherein said digital excitation signals comprise together a digital representation of a linear amplitude ramp.

10. The apparatus according to claim 6 wherein said unbiased weighting coefficient of the $m^{th}$ bit of a digital-to-analog converter under test is represented by:

$$a_m = \frac{\hat{a}_m}{2^m \alpha_{2m}}$$

where $\hat{a}_m$ is the output response weighting coefficient of the $m^{th}$ bit; and $\alpha_{2m}$ is the premeasured weighting coefficient of the $2m^{th}$ order output of said analog-to-digital converter, and wherein said correcting means is operative to multiply the output response weighting coefficient of the $m^{th}$ bit by the stored value $2^m/\alpha_{2m}$ for each $m^{th}$ bit in order to obtain the unbiased weighting coefficient of the $m^{th}$ bit which is the calibration of the DAC under test.

* * * * *